United States Patent [19]

Sutton

[11] Patent Number: 5,015,963
[45] Date of Patent: May 14, 1991

[54] SYNCHRONOUS DEMODULATOR

[75] Inventor: John F. Sutton, Greenbelt, Md.

[73] Assignee: The United States of America as represented by the Administrator of the National Aeronautics and Space Administration, Washington, D.C.

[21] Appl. No.: 414,815

[22] Filed: Sep. 29, 1989

[51] Int. Cl.$^5$ .............................................. H03D 1/04
[52] U.S. Cl. .................................. 329/361; 329/349; 307/353
[58] Field of Search ............... 329/349, 361; 307/350, 307/352, 353; 328/150, 151; 375/76

[56] References Cited

U.S. PATENT DOCUMENTS

| | | | |
|---|---|---|---|
| 3,602,826 | 8/1971 | List et al. | 307/353 X |
| 3,820,033 | 6/1974 | Iwata | 307/353 X |
| 4,167,650 | 9/1979 | Kusano | 329/361 X |
| 4,262,258 | 4/1981 | Gaalema | 307/353 X |
| 4,847,523 | 7/1989 | Schneider | 307/353 X |

FOREIGN PATENT DOCUMENTS

| | | | |
|---|---|---|---|
| 0209244 | 12/1983 | Japan | 329/361 |
| 0657581 | 4/1979 | U.S.S.R. | 329/361 |
| 0765984 | 9/1980 | U.S.S.R. | 329/361 |
| 1193766 | 11/1985 | U.S.S.R. | 329/361 |

Primary Examiner—David Mis
Attorney, Agent, or Firm—R. Dennis Marchant; Harold W. Adams; Ronald F. Sandler

[57] ABSTRACT

A synchronous demodulator includes a switch which is operated in synchronism with an incoming periodic signal and both divides and applies that signal to two signal channels. The two channels each include a network for computing and holding, for a predetermined length of time, the average signal value on that channel and applies those values, in the form of two other signals, to the inputs of a diffferential amplifier. The networks may be R-C networks. The output of the differential amplifier may or may not form the output of the synchronous detector and may or may not be filtered. The output will not include a periodic signal due to the presence of a dc offset. Additionally, the output will not contain any substantial ripple due to periodic components in the input signal. In a somewhat more complex version, containing twice the structural components of the above synchronous demodulator with a more complex switching mechanism, essentially all ripple due to periodic components in the input signal are eliminated.

24 Claims, 3 Drawing Sheets

SYNCHRONOUS DEMODULATOR

ORIGIN OF THE INVENTION

The invention described herein was made by an employee of the United States Government, and may be manufactured and used by or for the Government for government purposes without the payment of any royalties thereon or therefor.

TECHNICAL FIELD

This invention pertains to synchronous demodulators or synchronous detectors.

BACKGROUND ART

Historically, band pass filters were used to selectively amplify periodic signals in noise. This technique has the limitation that, if the filter bandwidth is made extremely small to improve noise rejection, the filter will have a tendency to "ring". Such resonant response makes a narrow band filter unsuitable for some types of signal processing situations. If the filter bandwidth is made relatively wide to avoid the ringing problem, then the noise rejection performance of the filter is degraded.

A second technique for detecting periodic signals in noise involves the use of a phase locked loop (PLL). The PLL is a closed loop control system consisting of a phase difference-to-voltage converter which drives a voltage-to-frequency converter which, in turn, provides a second input to the phase difference-to-voltage converter. While the PLL technique of detecting signals in noise works well in some applications, it is complex and less efficient than other techniques in certain other applications.

A third technique for detecting periodic signals in noise involves the use of a synchronous demodulator (SD). In the SD technique, a periodic switching function in synchronism with the periodic signal to be detected, i.e., a clock, is used to provide a switching modulation of the noisy periodic input signal. The resulting modulated signal is customarily filtered through a low pass filter, leaving only the dc component of the modulation process at the output of the filter. The magnitude of the dc component is proportional to the amplitude of the fundamental frequency component of the periodic signal to be detected. The SD process is equivalent to the time cross correlation, at zero time delay, of a noisy signal with a square wave having the same period as that of the fundamental period of the signal.

Numerous SD circuits have been devised for the purpose of synchronously detecting periodic signals in noise. A typical synchronous demodulator circuit, shown schematically in FIG. 1, consists of an amplifier, A, a switch, S, and a low pass filter, LPF. The gain of amplifier A can be switched alternately, for example, from +1 to −1, depending on the position of the switch, S, which is operated in synchronism with the input periodic signal to be detected. The positive and negative gains need not be one, as long as they are equal. While shown in FIG. 1 as a mechanical switch, in practice S customarily takes the form of a solid state switching circuit, employing either a JFET or a CMOS pass element. The operation of the electronic switch is customarily controlled by a logic input signal. Whatever the details of the switching element, it must provide the switching function described above. Usually some adjustment to correct for phase errors must be provided. FIG. 1A is a timing diagram which illustrates the operation of the amplifier of FIG. 1 with a sinusoidal input signal. Waveform 1 represents the sinusoidal input signal to the amplifier. Waveform 2 depicts the zero crossings of the input signal as well as the switch position of S, i.e., the switch operation synchronized with the incoming signal. In the example depicted in FIG. 1, the amplifier gain is switched at the zero crossings of a sinusoidal input signal in such a manner that the negative portions of the signal are amplified by a negative gain, resulting in a positive output, and the positive portions of the signal are amplified by a positive gain, also resulting in a positive output. The resultant demodulated signal, illustrated by waveform 3, is a full-wave rectified version of the input signal, consisting of a series of positive half-sine loops. The resultant full-wave rectified signal is passed through a low pass filter, which attenuates the ac components of the full wave rectified signal and passes the dc component unattenuated. The bandwidth of the filter, e.g., an R-C circuit, would be somewhat less than the frequency of the periodic signal. The rectified output from the amplifier A and the dc output of the LPF have amplitudes which are proportional to the amplitude of the original incoming sinusoidal signal. The process may be thought of as the linear multiplication of the input signal by a square wave signal of the same frequency, resulting in the production of Fourier frequency components at multiples of the signal frequency and at zero frequency. The low pass filter selectively passes the zero frequency component while attenuating all higher frequency components of the signal. Because the switch is operated in synchronism with the input signal, the signal is detected and a dc output is produced at the output of the LPF. Because any random noise at the input exhibits random phase with respect to the periodic operation of the switch, the low pass filter tends to average this random noise component to zero. The same is true for periodic input signals which are not phase coherent with the switching of the switch, S.

Any dc level superimposed on the periodic input signal results in the production, at the output, of a square wave component at the clock frequency. The low pass filter must be carefully designed to suppress, as much as possible, this square wave component, as well as the periodic components resulting from the full wave rectification of the input signal so that precise measurements can be made of the dc value of the low pass filter output. Regardless of the filter design, there will be a periodic component at the output which can limit the signal-to-noise ratio. Thus, the prior art SD produces an output signal having residual ac components resulting from two sources; the square wave signal produced at the output by any dc component at the input, and the full wave rectification signal at the output produced by the rectification function of the circuit on the periodic signal itself. Because a dc or very slowly varying ac signal is required for control purposes, a LPF is required at the SD output. The choice of the filter rise time or bandwidth involves a tradeoff. If the low pass filter rise time is made very large, the ripple may be attenuated to any degree desired, but the filter would have an unacceptably long rise time. If the filter time constant is made very small, it may have an acceptable rise time, but would not sufficiently attenuate the ripple components. Thus, the prior art SD will inherently produce ac components at the output which must be filtered, but any filter selection involves the above-described tradeoff. Thus, in a practical sense, the prior art SD produces a control signal with errors, or alternatively, a control signal which is limited in response time.

STATEMENT OF THE INVENTION

Accordingly, it is an object of this invention to provide an improved synchronous demodulator.

It is another object of this invention to provide an improved synchronous demodulator which does not produce a periodic signal at its output when a dc signal is present at the input.

It is yet another object of this invention to provide an improved synchronous demodulator which does not produce a periodic signal at its output when a periodic signal is present at the input.

It is still another object of this invention to provide an improved synchronous demodulator which does not require an output filter.

Briefly, these and other objects are achieved by providing a synchronous switch which is operated in synchronism with a periodic incoming signal and which, in turn, periodically applies portions of that signal to two different signal channels. Each of these channels includes a means for computing and holding, for a predetermined period of time, the average signal value on that channel, and applying that value in the form of another signal to one of the inputs of a differential amplifier, i.e., one channel drives the inverting input while the other drives the non-inverting input of the differential amplifier.

DETAILED DESCRIPTION OF THE INVENTION

Figure 2:
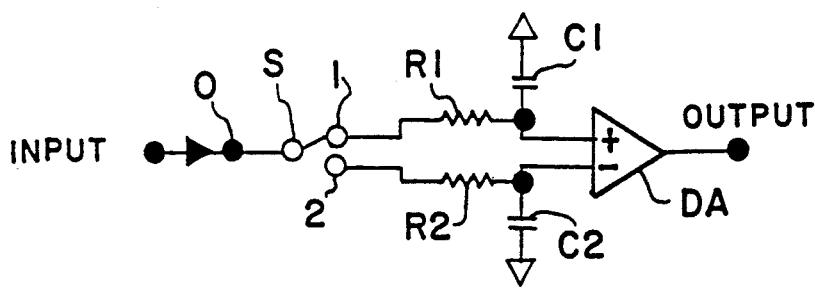
FIG. 2 is a schematic representation of the basic version of the synchronous demodulator of the instant invention.

A basic version of this invention, as shown schematically in FIG. 2, consists of a switch S, a differential amplifier DA, two resistors, R1 and R2, and two capacitors, C1 and C2. For low frequency applications, for example 100 Hz, S may be a type HI-5042 CMOS logic-controlled analog switch, manufactured by the Harris Corporation of Melbourne, Fla., and R1 and R2 may be 100 kΩ metal film resistors, and C1 and C2 may be 1 uF. teflon dielectric or polypropylene dielectric capacitors. Teflon or polypropylene dielectrics are preferable to other dielectric materials because they introduce less error due to a nonideal dielectric characteristic known as charge injection. Metal film resistors are important in applications where it is desired that the magnitude of resistance remain essentially constant over wide variations in temperature. The differential amplifier may be a model INA258, manufactured by the Burr-Brown Corporation of Tucson, Ariz. To avoid errors, the analog switch is chosen to present low leakage currents and high impedances compared to the resistance of R1 or R2, 100 kΩ, when open, and low resistance relative to the resistance of R1 or R2, when closed. The time constants R1C1 and R2C2 are customarily equal. The values of the time constants are chosen to satisfy a response time tradeoff. The time constants should be long enough to provide relatively good averaging over a half cycle of the periodic signal, but should be short enough so that the response time of the overall system is not excessive. The differential amplifier, DA, is preferably one having a high input impedance of the order of 100 MegΩ, relative to the resistance of R1 or R2, and a high common mode rejection ratio, CMRR, about 120 dB.

In this embodiment of the invention, the input signal at input terminal 0 is switched periodically and alternately to terminals 1 and 2 to cause the input signal to be present at terminal 1 only when the input signal voltage is positive, and to cause the input signal to be present at terminal 2 only when the signal voltage is negative, with respect to circuit common. Thus, R1 and C1 serve as a low pass filter section which produces the average value of the input signal during the positive portion of the cycle, and R2 and C2 serve as a low pass filter section which produces the average value of the input signal during the negative portion of the cycle. Under steady-state input signal conditions, during the time when S connects terminal 0 to terminal 1, C2 functions as a memory element, holding a negative voltage equal to the RC-averaged value of the input signal which it developed during the previous, negative, half cycle. During the next half cycle of the input signal, S connects terminal 0 to terminal 2 while C1 functions as a memory element, holding a positive voltage equal to the RC-averaged value of the input signal which it developed during the previous, positive, half cycle. The output of DA is a gain constant times the difference of the two capacitor voltages, that on C1 being positive, and that on C2 being negative, and is therefore an averaged, rectified, version of the input signal voltage.

Figure 1:
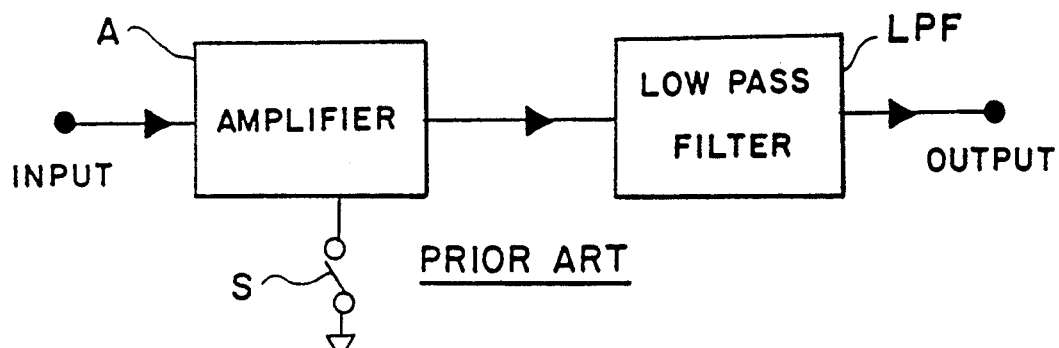
FIG. 1 is a schematic representation of the prior art synchronous demodulator discussed in the Background Art.
Figure 1A:
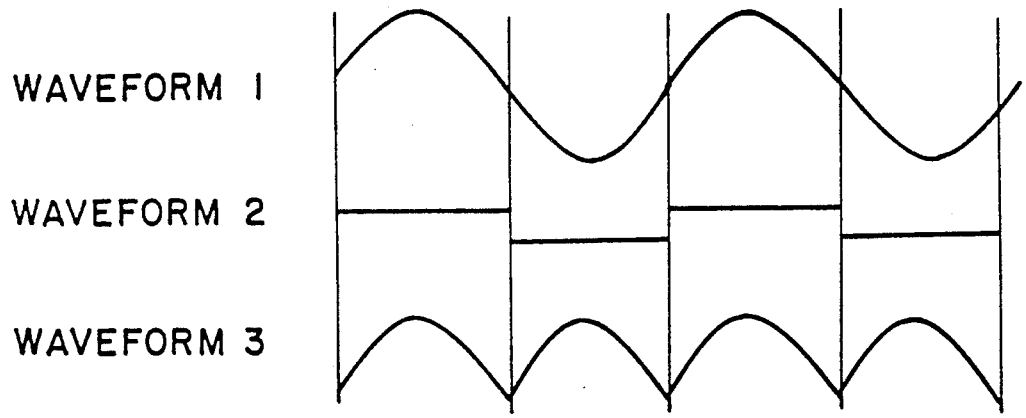
FIG. 1A is a typical timing diagram which describes the operation of the synchronous demodulator of FIG. 1, which diagram is also discussed in the Background Art.

If there is a dc component in the input signal at terminal 0, the DA suppresses it by the amount of the CMRR. The prior art synchronous demodulator, shown in FIG. 1, does not suppress the periodic output caused by a dc input. Also, the dc component at the output terminal of the DA of this invention is equal to twice the average value of the rectified input signal. This is double the dc-to-ripple ratio of the prior art synchronous demodulator shown in FIG. 1. Another advantage of the current invention over the prior art has to do with the basic symmetry of the improved SD circuit. If the switching function at the inputs to resistors R1 and R2 of FIG. 2 are performed by two identical analog switches, identical switch errors, such as glitches and dc offsets, will be applied to both inputs of the DA. Because identical error voltages are applied to both inputs of the DA, they will be eliminated by the DA because of its high CMRR. The SD of the prior art does not have this basic circuit symmetry, and so the error voltages introduced by the nonideal performance of the switches are not suppressed and will cause error voltages at the output.

Figure 2A:
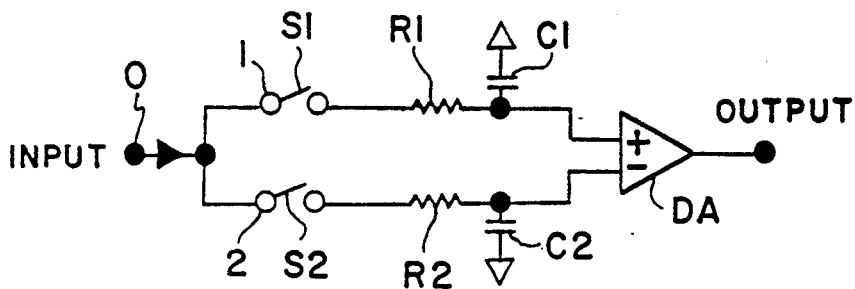
FIG. 2A is a schematic representation of a synchronous demodulator of the instant invention, similar to that of FIG. 2, with an alternate switch configuration.

FIG. 2A illustrates a circuit which is identical in structure and function to the circuit of FIG. 2 except that the input signal, at point 0, is periodically switched to inputs 1 and 2 via two, as opposed to one, single pole, single throw switches (S1, S2). Alternatively, the input signal may be periodically switched between the two input terminals by a pair of linear modulators or multipliers.

Figure 3:
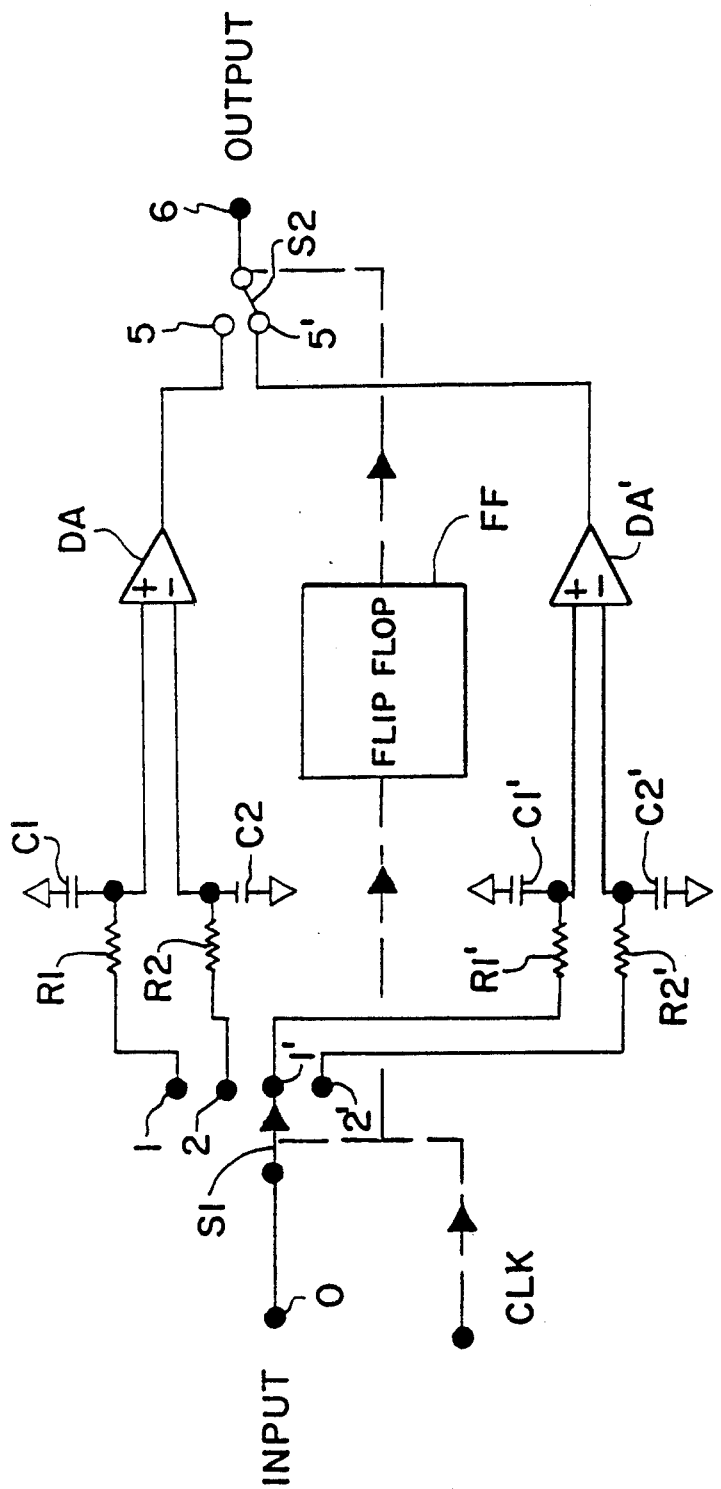
FIG. 3 is a schematic representation of another version of the synchronous demodulator of the instant invention.

A somewhat more advanced version of this invention, shown schematically in FIG. 3, employs two of the basic version synchronous demodulators of this invention. During two successive half cycles of the input signal, at point 0, DA, R1, C1, R2, C2, described above, function as they do in the basic version of this invention as described above. During the next two successive half cycles of the input signal, DA', R1', C1', R2', C2' also function as they do in the basic version of this invention described above. The switch S1 is switched sequentially from terminal 1 to 2 to 1' to 2' to 1, etc. such that the input signal is connected to each of these terminals for a duration of one half cycle, the terminals being connected to the input signal terminal in sequence in the order named. Thus, while S1 is at position 1' or 2', the input signal is disconnected from 1 and 2 of the DA, resulting in a steady dc level at terminal 5. Similarly, during the alternate cycles when S1 is at position 1 or 2, the input signal is disconnected from 1' and 2', resulting in a steady dc output from DA' at 5'. S2 is switched alternately each cycle to provide that terminal 6 is always connected to terminal 5 only when the output at terminal 5 is a dc level and to terminal 5' only when the output at terminal 5' is a dc level. A flip flop (FF) may, as shown, be employed to synchronize the switching of S2 with S1 by counting down the clock function by a factor of 2 so that the switch at the output switches only after a pair of networks has been contacted by the input switch. The advantage of the advanced version of the SD over the basic version is that the output signal at 6 is always a dc level only, there being essentially no periodic, i.e., ripple, components present. This fact can make an output low pass filter optional, i.e., the filter would only be employed when, for a particular application, small "glitches", caused by the operation of the switches, would be objectionable. This is particularly important in one possible application of the invention, a proportional-plus-integral temperature control system where the synchronous demodulator is used to detect the signal from a temperature sensor, usually a germanium resistance thermometer (GRT). In such systems, the low pass filter rise time cannot be made arbitrarily large because of closed loop control stability criteria. Prior art synchronous demodulators can produce significant ripple at the signal frequency which can introduce undesirable thermal inputs into the cryogenic system and crosstalk into any low level signal processing systems in the vicinity. In addition, the factor-of-two improvement in signal-to-broad band noise for a given filter bandwidth permits such control systems to be operated with double the bandwidth of the systems using the prior art.

Figure 4:
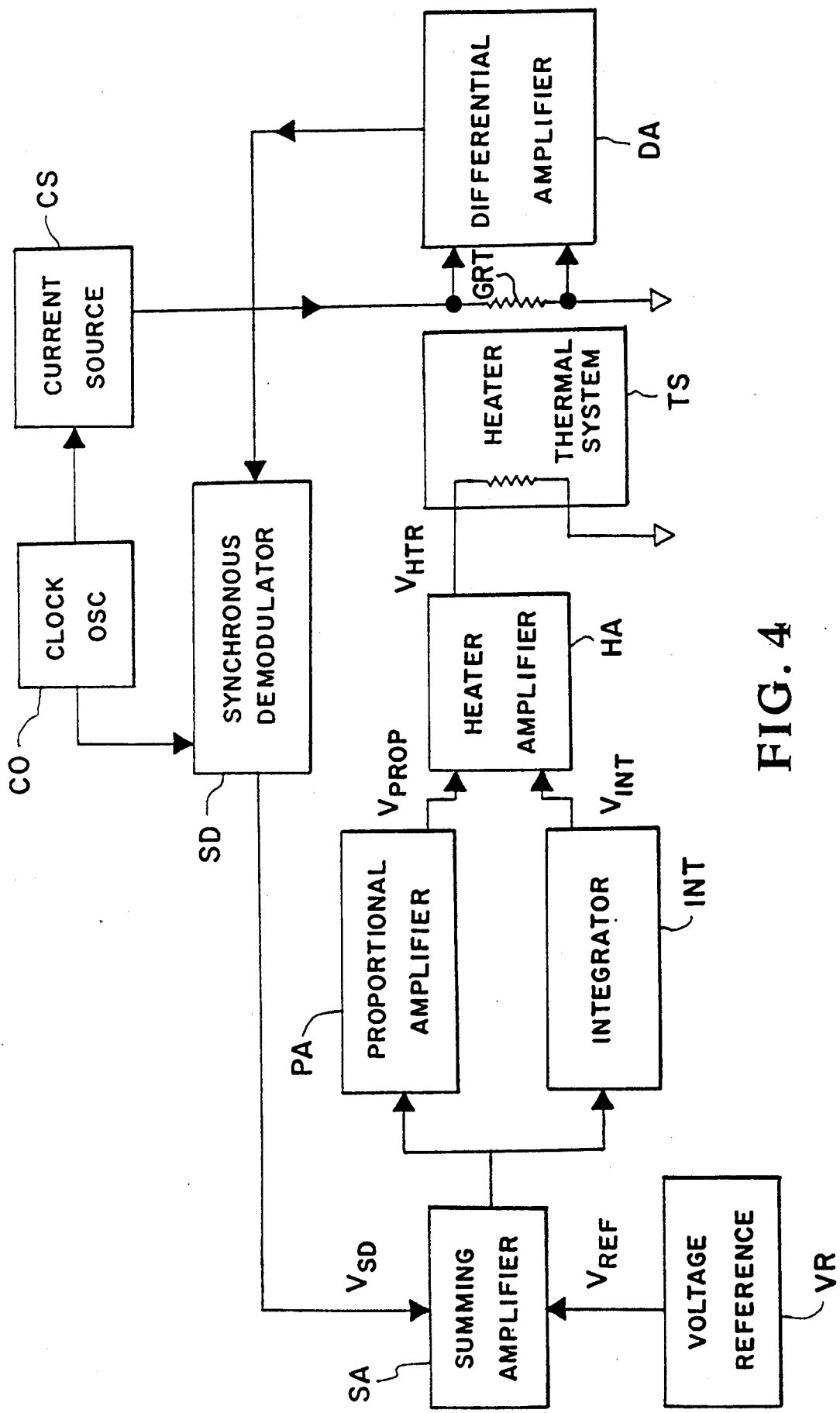
FIG. 4 is a block diagram representing a thermal control system in which the instant invention may be employed.

One such thermal control system, for a cryogenic system, is illustrated in the block diagram of FIG. 4. The control system consists of a voltage reference (VR), the output voltage of which, $V_{REF}$, is applied to one input of a summing amplifier (SA), which drives a proportional amplifier (PA) and an integrator (INT). The PA output, $V_{PROP}$, and the integrator output, $V_{INT}$, are summed together in a heater amplifier (HA), which drives the heater (HTR) contained within the thermal system (TS) with voltage, $V_{HTR}$. The temperature of the TS is sensed by a germanium resistance thermometer (GRT) which is excited by a current source (CS). The voltage across the GRT is applied to a difference amplifier (DA), the output of which is fed to a synchronous demodulator (SD). Finally, the SD output, voltage, $V_{SD}$, is summed with voltage, $V_{REF}$, in the SA. A clock oscillator (CO) synchronizes the SD with the CS.

When the system is at equilibrium at about 0.1 degree Kelvin, for example, the dc voltage produced by the SD is balanced against an equal and opposite voltage, $V_{REF}$, from the VR. $V_{REF}$ is a preselected value obtained from the calibration data of the GRT. At the same time, the integrator is holding a voltage, $V_{INT}$, which is applied at the output to the heater amplifier which, in turn, applies the voltage, $V_{HTR}$ to the heater. Any ripple voltage which may be present at the output of the SD passes through the PA and directly to the heater. Thus, if a prior art synchronous demodulator is employed, the heater will produce additional undesirable heat due to the ripple produced by the prior art synchronous demodulator. This extra heat causes the control system to come to equilibrium at an incorrect temperature. When the control system specifications are extremely stringent, i.e., fast system response time is required and only extremely small deviations from a selected temperature are allowed, such errors may be unacceptable. By using the improved SD described herein, which does not produce ripple voltages, no ripple errors are introduced into the control system.

I claim:
1. A synchronous demodulator comprising:
   a differential amplifier with inverting and noninverting inputs and an output;
   a pair of network means, each of said network means including a low pass filter for providing signal averaging and voltage storage, connected to said amplifier, each one of said pair of network means being connected to a respective one of said inputs; and,
   means to apply an essentially periodic incoming signal alternately between each of said pair of network means,
   whereby a signal is developed at said differential amplifier output, said output signal having a relatively high signal-to-ripple characteristic and from which output signal any dc offset present in the incoming signal has been essentially suppressed.

2. The synchronous demodulator of claim 1, wherein said network means are resistance-capacitance circuits.

3. The synchronous demodulator of claim 1, wherein each of said network means is identical.

4. The synchronous demodulator of claim 1, wherein said differential amplifier has a relatively high common mode rejection ratio.

5. The synchronous demodulator of claim 1, wherein said means to alternately apply said incoming signal includes a switch.

6. The synchronous demodulator of claim 5, wherein said switch is a single pole, double throw switch.

7. The synchronous demodulator of claim 5, wherein said switch is a pair of single pole, single throw switches.

8. The synchronous demodulator of claim 7, wherein said pair of single pole, single throw switches includes two identical switches.

9. The synchronous demodulator of claim 5, wherein said switch includes a linear multiplier.

10. The synchronous demodulator of claim 5, wherein said switch includes a solid state, logic-controlled analog switch.

11. The synchronous demodulator of claim 2, wherein each of said resistance-capacitance circuits includes a resistance in series with, and a capacitance in parallel with, one of said amplifier inputs.

12. A synchronous demodulator comprising:
first and second differential amplifiers, each of which having inverting and noninverting inputs and an output;
two pairs of network means, each of said network means providing low pass filtering and voltage storage, each pair of which is connected to a respective one of said first and second amplifiers and each network means of each pair being connected to one of said inputs, respectively, of said each respective amplifier; and,
means to apply an incoming signal, through each of said network means, in a predetermined sequence, to said inverting and noninverting inputs of said first amplifier and then, in the same sequence, to each of the inverting and noninverting inputs of said second amplifier, the output of said synchronous demodulator being formed by the combined outputs of said amplifiers through a switch means.

13. The synchronous demodulator of claim 12, wherein said network means are resistance-capacitance circuits.

14. The synchronous demodulator of claim 12, wherein each of said network means is identical.

15. The synchronous demodulator of claim 12, wherein each of said differential amplifiers has a high common mode rejection ratio.

16. The synchronous demodulator of claim 12, wherein means to sequentially apply said incoming signal includes a switch.

17. The synchronous demodulator of claim 16, wherein said switch is a single pole, multithrow switch.

18. The synchronous demodulator of claim 16, wherein said switch includes a linear multiplier.

19. The synchronous demodulator of claim 12, wherein said switch means includes a single pole, multithrow switch.

20. The synchronous demodulator of claim 16, wherein said switch includes a logic-controlled, solid state analog switch.

21. The synchronous demodulator of claim 12, wherein said switch means includes a logic-controlled, solid state analog switch.

22. The synchronous demodulator of claim 12, wherein each of said network means includes a resistance in series with, and a capacitance in parallel with, one of said amplifier inputs.

23. A synchronous demodulator comprising:
means to alternately apply an essentially periodic incoming signal to each of two channels, each of said channels including further means to compute and retain a second signal, over one-half cycle, or more, of said input signal, derived from the portion of said incoming signal applied to each respective channel, said second signals representing the average value of said incoming signal, in each of said channels, over a predetermined period of time; and,
means to compute the difference between the said retained second signals in each of said channels.

24. The synchronous demodulator of claim 23, wherein said means to compute and retain a second signal includes a resistance-capacitance circuit.

* * * * *